United States Patent
Chen et al.

(10) Patent No.: US 8,467,675 B2
(45) Date of Patent: Jun. 18, 2013

(54) CAMERA MODULE

(75) Inventors: Wei Chen, Shenzhen (CN); Li-Zong Gong, Shenzhen (CN); Tang-Hong Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 45 days.

(21) Appl. No.: 13/178,523

(22) Filed: Jul. 8, 2011

(65) Prior Publication Data

US 2012/0224844 A1    Sep. 6, 2012

(30) Foreign Application Priority Data

Mar. 4, 2011  (CN) .......................... 2011 2 0055220

(51) Int. Cl.
*G03B 17/02* (2006.01)
(52) U.S. Cl.
USPC ............................ 396/535; 359/819; 348/374

(58) Field of Classification Search
USPC .................................. 396/535; 359/814, 819
See application file for complete search history.

(56) References Cited

U.S. PATENT DOCUMENTS

| | | | | |
|---|---|---|---|---|
| 5,673,083 A * | 9/1997 | Izumi et al. | | 348/340 |
| 6,122,009 A * | 9/2000 | Ueda | | 348/335 |
| 6,939,501 B2 * | 9/2005 | Grigg et al. | | 264/401 |
| 7,227,577 B2 * | 6/2007 | Tanida et al. | | 348/340 |
| 7,687,819 B2 * | 3/2010 | Vittu | | 257/98 |
| 7,830,626 B2 * | 11/2010 | Ke | | 359/819 |
| 2007/0097518 A1 * | 5/2007 | Sanou et al. | | 359/694 |
| 2007/0287314 A1 * | 12/2007 | Ma | | 439/188 |
| 2011/0234890 A1 * | 9/2011 | Kobayashi et al. | | 348/373 |

* cited by examiner

*Primary Examiner* — Clayton E LaBalle
*Assistant Examiner* — Leon W Rhodes, Jr.
(74) *Attorney, Agent, or Firm* — Altis Law Group, Inc.

(57) ABSTRACT

A camera module includes an image sensor, a lens assembly mounted on the image sensor, and a shell defining a receiving space. The image sensor and the lens assembly are accommodated in the receiving space. The lens assembly is fixedly engaged in the shell.

8 Claims, 2 Drawing Sheets

CAMERA MODULE

BACKGROUND

1. Technical Field

The present disclosure relates to camera modules, and particularly to a wafer level package (WLP) camera module.

2. Description of Related Art

WLP camera modules have been used in portable electronic devices e.g., mobile phones. However, the WLP camera modules are structurally weak. The structure of the WLP camera modules may be damaged if struck, or even if roughly handled, thus reducing the imaging quality of the WLP camera modules.

Therefore, it is desirable to provide a new camera module, which can overcome the above-mentioned limitations.

DETAILED DESCRIPTION

Figure 1:
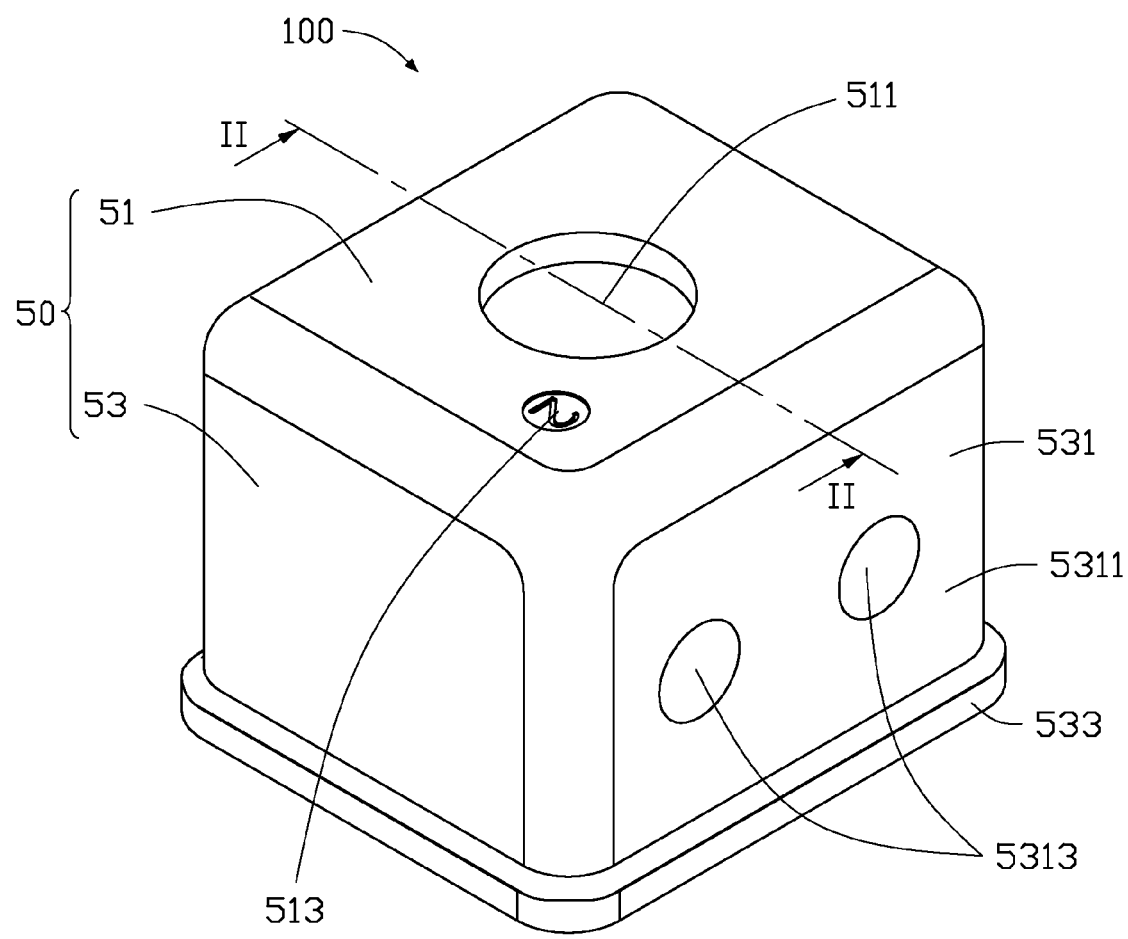
FIG. 1 is an isometric view of a camera module according to an embodiment.
Figure 2:
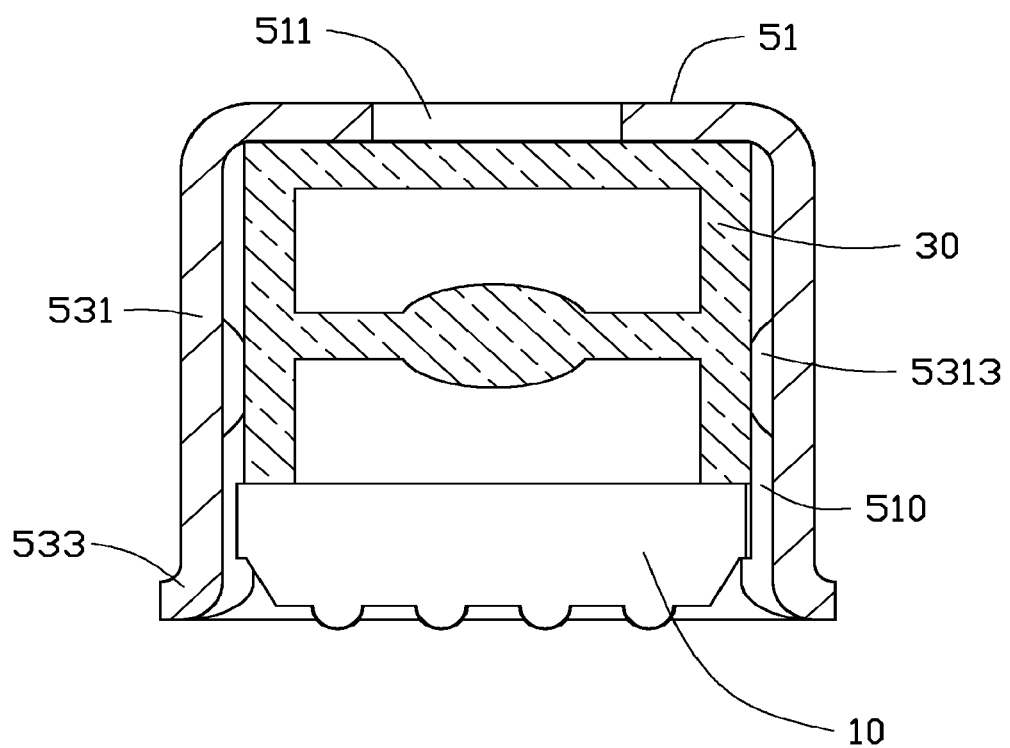
FIG. 2 is a cross-sectional view of the camera module, taken along the line II-II of FIG. 1.

Referring to FIGS. 1-2, a camera module 100 according to one embodiment includes an image sensor 10, a lens assembly 30 mounted on the image sensor 10, and a shell 50.

The image sensor 10 is made by the wafer level package process. The image sensor 10 may be a charge coupled device (CCD) or a complementary metal oxide semiconductor (CMOS) sensor.

The lens assembly 30 is also made by the wafer level package process. The lens assembly 30 includes one or more lenses.

The shell 50 is substantially a hollow cuboid. The shell 50 includes a top wall 51 and a peripheral wall 53. The top wall 51 and the peripheral wall 53 cooperatively form a receiving space 510. The image sensor 10 and the lens assembly 30 are in the receiving space 510. The top wall 51 is substantially square, and defines a central through hole 511 which allows the ingress of light into the camera module 100, to strike the image sensor 10. The top wall 51 further includes an identification area 513 at a corner. The identification area 513 is for indicating the electrical polarity of the camera module 100. The peripheral wall 53 extends perpendicularly from the edges of the top wall 51. The peripheral wall 53 includes four sidewalls 531 and a fixing part 533. At least one sidewall 531 includes a main body 5311 and an engaging part 5313. The engaging part 5313 is for engaging with the lens assembly 30, thus holding the lens assembly 30 in the shell 50 steadily. The engaging part 5313 is convex in shape, protruding inwards towards the receiving space 510. The engaging part 5313 is arc-shaped in cross-section. The engaging part 5313 is protruding from the main body 5311 towards the receiving space 510 of the shell 50. The fixing part 533 flares out from the bottom end of the four sidewalls 531. The fixing part 533 is for coupling with a printed circuit board (not shown) so that the camera module 100 is mounted on the printed circuit board.

In the present embodiment, only two opposite sidewalls 531 include engaging parts 5313, and each of the two opposite sidewalls 531 includes two engaging parts 5313, spaced as approximated in FIG. 1. The other opposing pair of the sidewalls 531 may include engaging parts 5313. The total number of the engaging parts of a sidewall 531 may be one, or three, or more.

The shell 50 may be made of copper, copper alloy, or plastic. The shell 50 may be soldered to the printed circuit board.

In the present embodiment, the shell 50 covers and protects the image sensor 10 and the lens assembly 30. Accordingly, the vulnerability to shock and vibration, and structural strength of the camera module 100 is improved, and therefore the stability and performance of the camera module 100 is improved. When the shell 50 is made of metal, this will improve the antistatic defences of the camera module 100 and enhance the imaging quality.

While various embodiments have been described, it is to be understood that the disclosure is not limited thereto. On the contrary, various modifications and similar arrangements (as would be apparent to those skilled in the art), are also covered. Therefore, the scope of the appended claims should be accorded the broadest interpretation so as to encompass all such modifications and similar arrangements.

What is claimed is:

1. A camera module, comprising:
an image sensor;
a lens assembly mounted on the image sensor; and
a shell comprising a receiving space, a through hole in communication with the receiving space, at least one engaging part protruding from an inner wall of the shell toward the receiving space, and a fixing part extending outwardly from a distal end of the shell away from the receiving space, the image sensor and the lens assembly being accommodated in the receiving space, and the lens assembly being fixedly engaged in the shell by the at least one engaging part.

2. The camera module of claim 1, wherein the shell comprises a top wall and a peripheral wall extending from edges of the top wall, and the top wall and the peripheral wall cooperatively form the receiving space.

3. The camera module of claim 2, wherein the through hole is formed through the top wall.

4. The camera module of claim 2, wherein the top wall further comprises an identification area at a corner thereof, and the identification area is for indicating an electrical polarity of the camera module.

5. The camera module of claim 2, wherein the peripheral wall comprises a plurality of sidewalls, and the at least one engaging part is positioned on one of the sidewalls.

6. The camera module of claim 1, wherein the engaging part is arc-shaped in cross-section.

7. The camera module of claim 5, wherein the fixing part extends outwardly from the distal end of the sidewalls away from the top wall, and is configured for coupling with a printed circuit board.

8. The camera module of claim 1, wherein the shell is comprised of material selected from the group consisting of copper, copper alloy, and plastic.

* * * * *